(12) United States Patent
Yu et al.

(10) Patent No.: US 10,039,182 B2
(45) Date of Patent: Jul. 31, 2018

(54) ELECTRONIC TRANSFER CARED

(71) Applicants: Shenzhen Tronixin Electronics Co., Ltd, Shenzhen (CN); Component User Industry Co., LTD, Taoyuan (TW)

(72) Inventors: Yongxiang Yu, Shenzhen (CN); Zhijun He, Shenzhen (CN); Tzu Han Wu, Taoyuan (CN)

(73) Assignees: SHENZHEN TRONIXIN ELECTRONICS CO., LTD, Shenzhen (CN); COMPONENT USER INDUSTRY CO., LTD, Taoyuan (CN)

( * ) Notice: Subject to any disclaimer, the term of this patent is extended or adjusted under 35 U.S.C. 154(b) by 0 days.

(21) Appl. No.: 15/381,467

(22) Filed: Dec. 16, 2016

(65) Prior Publication Data
US 2017/0318662 A1 Nov. 2, 2017

(30) Foreign Application Priority Data
Apr. 28, 2016 (CN) .......................... 2016 1 0284698

(51) Int. Cl.
*H05K 5/00* (2006.01)
*H05K 1/02* (2006.01)
*G06K 19/077* (2006.01)

(52) U.S. Cl.
CPC ..... *H05K 1/0213* (2013.01); *G06K 19/07732* (2013.01)

(58) Field of Classification Search
CPC ...... H05K 1/0213; H01R 12/65; H01R 12/78; H01R 12/716; H01R 13/2442; H01R 13/26; H01R 13/6599; H01R 13/6658; G06K 19/07732; G06K 19/07741

USPC ........ 361/752; 235/441; 439/76.1, 499, 630, 439/676
See application file for complete search history.

(56) References Cited

U.S. PATENT DOCUMENTS

| | | | |
|---|---|---|---|
| 4,767,357 A * | 8/1988 | Hasircoglu | H01R 12/78 439/499 |
| 5,021,760 A * | 6/1991 | Krubsack | H01H 50/20 335/196 |
| 2006/0076410 A1* | 4/2006 | Ko | H01R 13/6599 235/441 |

(Continued)

*Primary Examiner* — Timothy Thompson
*Assistant Examiner* — Guillermo Egoavil
(74) *Attorney, Agent, or Firm* — Billion & Armitage; Benjamin C. Armitage

(57) ABSTRACT

An electronic transfer card is provided, including a bottom shell, an upper cover located above the bottom shell, and an accommodating cavity formed by enclosing the bottom shell and the upper cover and provided with a socket and a window, a first and second plastic component are arranged in the accommodating cavity, the first plastic component is clamped in the bottom shell and provided with a plurality of first connecting terminals capable of electrically contacting with a clip piece, the second plastic component is partly overlapped in the first plastic component, the first plastic component is provided with a plurality of second connecting terminals electrically contacting with the clip piece and an electric conduction portion capable of performing information transmission to an external electronic component, and electric conduction portion is electrically communicated with each of the second connecting terminals; an electronic device is further provided, comprising the above transfer card.

8 Claims, 4 Drawing Sheets

(56) References Cited

U.S. PATENT DOCUMENTS

| | | | |
|---|---|---|---|
| 2006/0223376 A1* | 10/2006 | Chang | H01R 13/2442 439/630 |
| 2012/0331337 A1* | 12/2012 | Otsuka | G06F 11/10 714/6.1 |
| 2014/0256164 A1* | 9/2014 | Lin | G06K 19/07732 439/76.1 |
| 2015/0125954 A1* | 5/2015 | Zimmermann | C12M 45/22 435/366 |

\* cited by examiner

ELECTRONIC TRANSFER CARED

TECHNICAL FIELD

The present invention relates to electronic information conversion, and more particularly, to an electronic transfer card and an electronic device.

BACKGROUND

A traditional SD4.0 UHS-II electronic transfer card is designed by PCB layout so as to meet an SD4.0 UHS-II function. In addition, a surface of the electronic transfer card is welded with a MODING piece to achieve data transfer between SD4.0 UHS-II and MICRO SD UHS-II, so that the assembling and welding process is complicated, and the reject ratio is higher.

SUMMARY

The present invention aims at providing an electronic transfer card, which is designed to solve a problem of more troublesome manufacturing of the existing transfer card.

The present invention is realized in this way:

an electronic transfer card is provided according to a embodiment of the present application, comprising a bottom shell, an upper cover located above the bottom shell, and an accommodating cavity formed by enclosing the bottom shell and the upper cover, the accommodating cavity being provided with a socket for a clip piece to insert and a window capable of performing information transmission to a external electronic component, wherein: a first plastic component and a second plastic component are arranged in the accommodating cavity; the first plastic component is clamped in the bottom shell, and is provided with a plurality of first connecting terminals capable of electrically contacting with the clip piece; the second plastic component is arranged on an partly overlapped with the first plastic component; the first plastic component is provided with a plurality of second connecting terminals capable of electrically contacting with the clip piece and an electric conduction portion capable of performing the information transmission to the external electronic component; and the electric conduction portion is electrically communicated with each second connecting terminal.

Further, the first plastic component is provided with a first opening and a second opening, each of the first connecting terminals is located in the first opening, and each of the second connecting terminals is extended from an end portion of the second plastic component into the second opening.

Further, each of the first connecting terminals and the second connecting terminals is respectively provided with a bending portion protruding out of a surface of the first plastic component departing from the bottom shell.

Further, all of the bending portions of the first connecting terminals and the second connecting terminals are located in a same plane.

Further, the second plastic component is provided with a projection at a side thereof next to the first plastic component, each of the second connecting terminals is lead out from an end portion of the projection, and the projection is clamped in the second opening.

Further, the bottom shell is provided with a first recessed portion and a second recessed portion, a bottom surface of the second recessed portion protrudes out of a bottom surface of the first recessed portion, the first plastic component is provided with a first engagement surface engaged with the bottom surface of the first recessed portion and a second engagement surface engaged with the bottom surface of the second recessed portion, and edges of the first plastic component are successively snapped to side walls of the first recessed portion and side walls of the second recessed portion.

Further, the bottom shell is provided with two cutting edges at the side walls thereof, which are arranged opposite to each other, and the edges of the second plastic component are snapped with the two cutting edges.

Further, the bottom shell is removably connected to the upper cover through a plurality of buckle structures, and each of the buckle structures is successively arranged along the edge of the bottom shell at interval.

Further, the window is opened in the bottom shell, and the socket is located at one end of the bottom shell far away from the window.

The embodiment of the present invention further provides an electronic device, comprising a housing and a processor built in the housing, further comprising the electronic transfer card, wherein the electronic transfer card is installed in the housing, and the electric conduction portion is electrically communicated with the processor.

The invention has the advantageous effects as follows:

In the transfer card of the present invention, the bottom shell and the upper cover are enclosed to form the accommodating cavity, and both of the two are carriers of the electronic component. The core electronic information conversion portion of the transfer card is the first plastic component and the second plastic component, and plays a role of a golden finger through each of the first connecting terminals and the connecting terminals thereon. When a Mico SD card is inserted into the accommodating cavity through the socket, two groups of electrical contact points on the Mico SD card are electrically contacted with the first connecting terminals and the second connecting terminals respectively, so as to achieve the data conversion between the Mico SD card and a SD card, that is to say, the data information of the Mico SD may be read from the electronic device through the transfer card. Both of the first plastic component and the second plastic component are moding pieces, and are subject to injection molding, so that the transfer card is convenient to manufacture, and the cost is relatively low. In addition, when being installed in the bottom shell and the upper cover, both of the first plastic component and the second plastic component may be fixed in a clamping manner, so as to avoid a welding process caused by a PCB. As a result, the transfer card is very easy to assemble and may be applicable to automata assembly, which further effectively reduces the manufacturing cost of the transfer card.

BRIEF DESCRIPTION OF THE DRAWINGS

In order to more clearly illustrate the embodiments of the invention or the technical scheme in the prior art, the drawings as required to use in the description of the embodiments or the prior art are simply introduced hereinafter. Obviously, the drawings in the description hereinafter only show some embodiments in the invention, such that those common skilled in the art can further acquire other drawings according to these drawings at the premise without giving creative work, wherein.

DETAILED DESCRIPTION

The technical solutions in the embodiments of the present invention will be described clearly and completely with reference to the drawings in the embodiments of the present invention. Apparently, the embodiments described are merely partial embodiments of the present invention, rather than all embodiments. All the other embodiments derived by those having ordinary skills in the art on the basis of the embodiments of the present invention without going through creative efforts shall all fall within the protection scope of the present invention.

Figure 1:
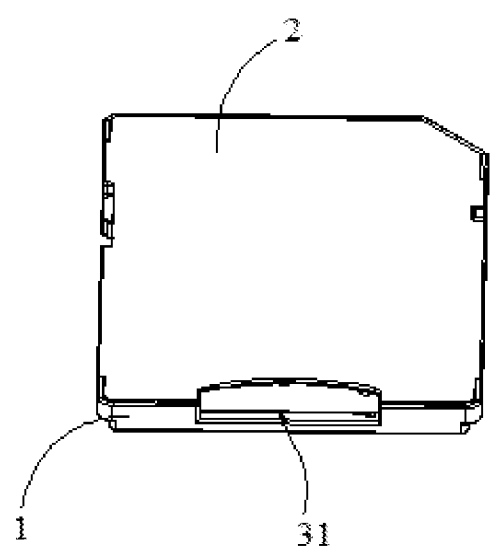
FIG. 1 is a structural diagram of an electronic transfer card provided by embodiments of the present invention.
Figure 2:
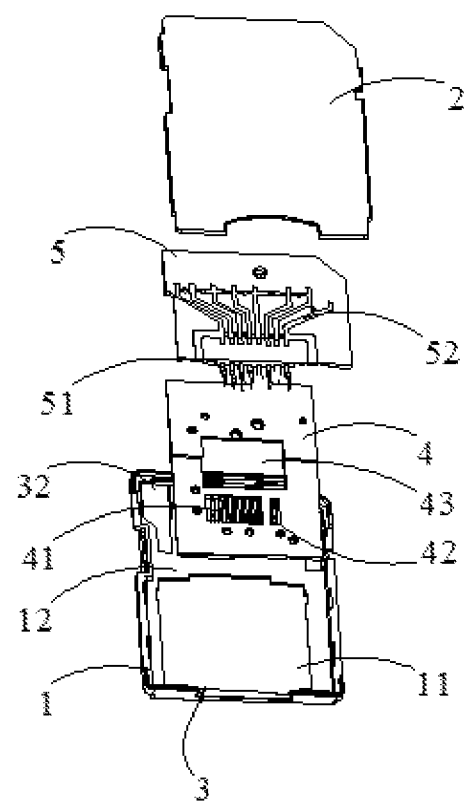
FIG. 2 is an explosive view of the electronic transfer card of FIG. 1.
Figure 3:
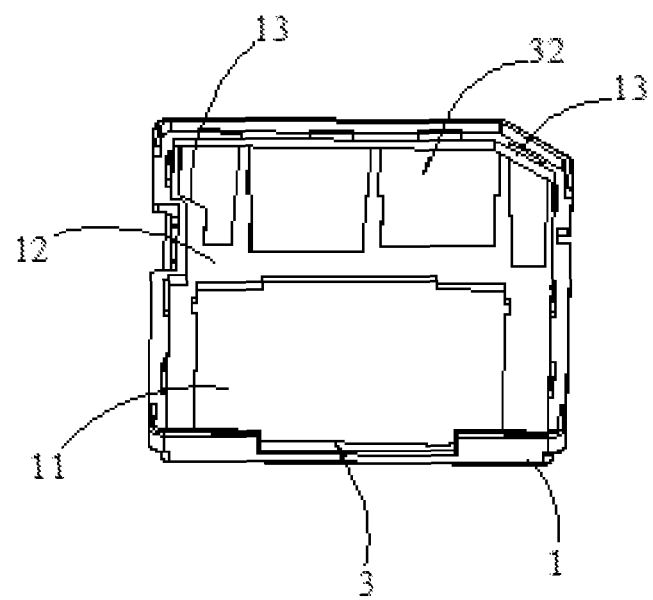
FIG. 3 is a structural diagram of a bottom shell of the electronic transfer card of FIG. 1.
Figure 4:
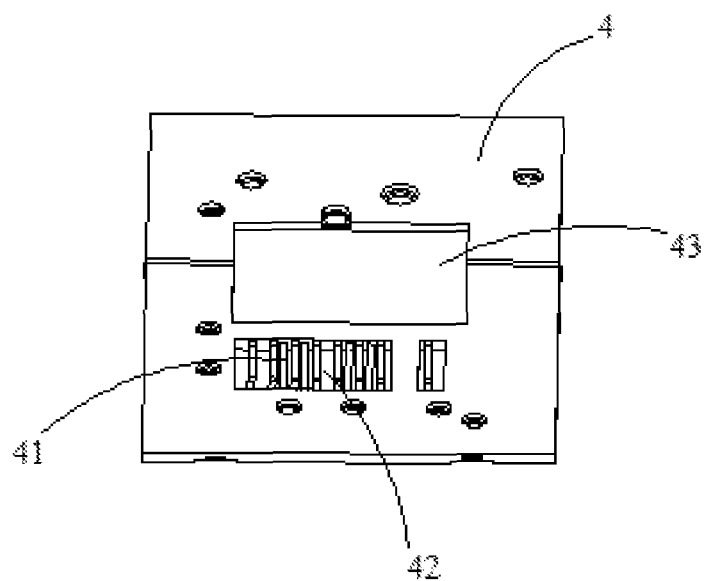
FIG. 4 is a structural diagram of a first plastic component of the electronic transfer card of FIG. 1.
Figure 5:
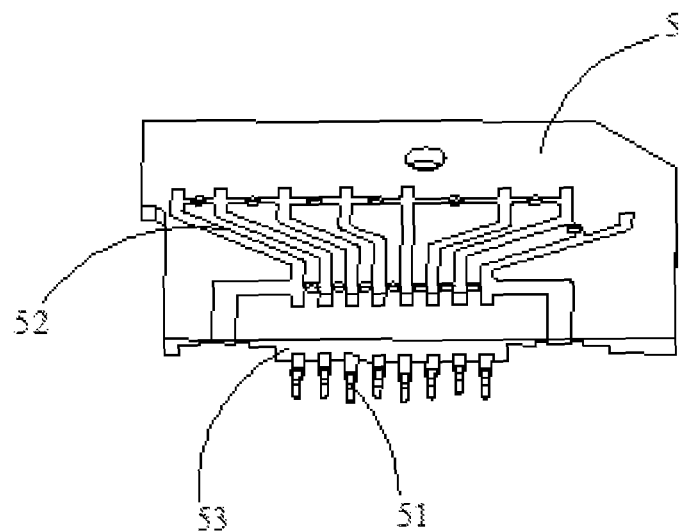
FIG. 5 is a structural diagram of a second plastic component of the electronic transfer card of FIG. 1.

Referring to FIGS. 1 to 3, an electronic transfer card is provided according to an embodiment of the present invention, which is mainly used for achieving data function conversion between Mico SD and SD, to be specific, clamping a Mico SD UHS-II card in an electronic device to read data information. The electronic transfer card comprises a bottom shell 1 and an upper cover 2 located above the bottom shell 1, both of which are correspondingly installed to enclose as an accommodating cavity 3. The accommodating cavity 3 is provided with a socket 31 and a window 32, wherein the socket 31 is mainly used for a clip piece to insert, that is to say, the Mico SD UHS-II card may be extended into the accommodating cavity 3 through the socket 31, while the window 32 is used for an external electronic component to transmit the data information, that is to say, the data information of the Mico SD UHS-II card is conversed by the transfer card, and then transmitted to the electronic device to read. A first plastic component 4 and a second plastic component 5 are installed in the accommodating cavity 3, which are both important electronic components for the data conversion function of the transfer card. The first plastic component 4 is clamped in the bottom shell 1, and is provided with a plurality of first connecting terminals 41. Each of the first connecting terminals 41 is a gold-plated contact piece, and is capable of electrically contacting with one group of contact points of the Mico SD UHS-II card. While the second plastic component 5 is provided with a plurality of second connecting terminals, each of the second connecting terminals 51 is also the gold-plated contact piece, and is capable of electrically contacting with the other group of contact points of the Mico SD UHS-II card. A function of golden finger of the transfer card may be formed through each of the first connecting terminals 41 and the connecting terminals 51, so as to achieve the data information conversion in the Mico SD UHS-II card. In addition, the second plastic component 5 is further provided with an electric conduction portion 52, through which the information transmission with the electronic component of the external electronic device may be formed. The electric conduction portion 52 shall be connected with each of the second connecting terminals 51 certainly. The conversed data information is transmitted through the electric conduction portion 52 to the electronic device for reading. The second plastic component 5 is also installed in the accommodating cavity 3 in a clamping form, and is partly overlapped in the first plastic component 4. In the present invention, the first plastic component 4 is provided with the first connecting terminals 41, the second plastic component 5 is provided with the second connecting terminals 51. Both of the first plastic component 4 and the second plastic component 5 are moding pieces, and are subject to injection molding during manufacturing, so that the manufacturing process is very simple and the cost is very low compared with the manufacturing process of the traditional PCB. When both of the two are installed in the accommodating cavity 3, a mechanical structure is used for clamping, and no welding is needed between two plastic components, so that both disassembly and assembly are relatively convenient. In addition, such fixing form is more applicable to the installation of automata. In this way, the yield of the product may be guaranteed, and the manufacturing cost of the transfer card may be further reduced during large batch production, so that the production efficiency is increased.

Referring to FIGS. 1, 3 to 5, further, the first plastic component 4 is provided with a first opening 42 and a second opening 43, each of the first connecting terminals 41 is located in the first opening 42, while each of the second connecting terminals 51 is extended from an end portion of the second plastic component 5 into the second opening 43. In this embodiment, the first opening 42 is arranged directly with respect to the second opening 43. Each of the first connecting terminals 41 is located in the first opening 42, while each of the second connecting terminals 51 is located in the second opening 43. When the Mico SD UHS-II card moves along the surface of the first plastic component 4 departing from the bottom shell 1, a resisting action caused by each of first connecting terminals 41 and the second connecting terminals 51, which limits the movement of the Mico SD UHS-II card, may be avoided, so that two groups of contact points of the Mico SD UHS-II card may be respectively contacted with each of the first connecting terminals 41 and the second connecting terminals 51. Generally, the window 32 of the accommodating cavity 3 is opened in the bottom shell 1, and the socket 31 is located at one end of the bottom shell 1 far away from the window 32. The first plastic component 4 is arranged from one end of the bottom shell 1 close to the socket 31 to one end of the window 32, while the second plastic component 5 is arranged from one end of the bottom shell 1 close to the window 32 to one end of the socket 31, and both of the two are overlapped in a middle position of the bottom shell 1, so that the Mico SD UHS-II card is engaged with the first plastic component 4 after it is extended from the socket 31, and it facilitates the data transmission of the second plastic component with the electronic device through the window 32 at the same time.

Figure 6:
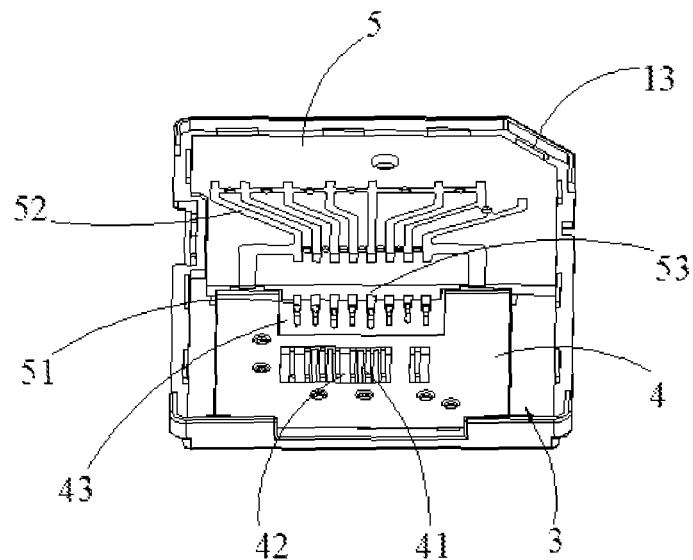
FIG. 6 is a structural diagram of the first plastic component and the second component of the electronic transfer card of FIG. 1 installed in the bottom shell.

Referring to FIG. 1 and FIG. 6, the above embodiment is optimized, each of the first connecting terminals 41 and the second connecting terminals 51 is provided with a bending portion protruding out of a surface of the first plastic component 4 departing from the bottom shell 1. In this embodiment, both of the first connecting terminals 41 and the second connecting terminals 51 are contact pieces. During manufacturing, the contact pieces are buckled, so that each of the first connecting terminals 41 and the second connecting terminals 51 is in a structural form of spring piece at a corresponding bending portion. When the Mico SD UHS-II card is extended into the accommodating cavity 3 through the socket 31, the Mico SD UHS-II card is partly engaged with a surface of the first plastic component 4 at one side departing from the bottom shell 1. As each bending portion protrudes out of the surface of the first plastic component 4, the Mico SD UHS-II card produces a pressure to the bending portion of each of the first connecting terminals 41 and the second connecting terminals 51. Of course, each of the bending portions produces a corresponding reactive force to the Mico SD UHS-II card, so that the bending portion may be contacted with the Mico SD UHS-II card stably. While in general, all of the bending portions of the first connecting terminals 41 and the second connecting terminals 51 are located in the same plane, that is to say, the height of each bending portion protruding out of the corresponding surface of the first plastic component 4, the acting force of the Mico SD UHS-II card to each portion is the same, thereby avoiding a problem of unstable contact between one or more bending portions and the Mico SD UHS-II card.

Referring to FIG. 2 and FIG. 6, the above embodiment is continuously optimized, the second plastic component 5 is provided with a projection 53 at a side next to the first plastic component 4, each of the second connecting terminals 51 is lead out from an end portion of the projection 53 to outside, and the projection 53 is clamped in the second opening 43 of the first plastic component 4 at the same time. In the present invention, as the second plastic component 5 is partly overlapped with the first plastic component 4, and each of the second connecting terminals 51 needs to extend into the second opening 43 at the same time. For this embodiment, the second plastic component 5 is provided with the projection 53 structure, that is to say, a thickness of the second plastic component 5 corresponding to the second opening 43 is relatively large, so that it facilitates each of the second connecting terminals 51 to extend into the second opening 43, and a connecting structure may be formed between the first plastic component 4 and the second plastic component 5 at the same time.

Referring to FIG. 2 and FIG. 3, further, the bottom shell 1 is provided with a first recessed portion 11 and a second recessed portion 12. A bottom surface of the second recessed portion 12 protrudes out of a bottom surface of the first recessed portion 11, that is to say, a stepped structure is formed between the first recessed portion 11 and the second recessed portion 12. The first plastic component 4 is provided with a first engagement surface and a second engagement surface. When the first plastic component 4 is installed in the bottom shell 1, the first engagement surface is engaged with the bottom surface of the first recessed portion 11, the second engagement surface is engaged with the bottom surface of the second recessed portion 12, and the edges of the first plastic component 4 are successively snapped to the side walls of the first recessed portion 11 and the side walls of the second recessed portion 12. In this embodiment, a clamping structure between the bottom shell 1 and the first plastic component 4 is refined, an inner bottom surface of the bottom housing 1 is in a structural form of stepped surface, so that the first plastic component 4 may be clamped and tightened in the first recessed portion 11 and the second recessed portion 12. For a clamping structure between the bottom shell 1 and the second plastic component 5, the side walls of the bottom shell 1 are provided with two cutting edges 13, which are arranged opposite to each other, and the edges of the second plastic component 5 are snapped with the two cutting edges 13. Of course, the two cutting edges 13 are not always arranged directly opposite to each other, but shall be arranged away from each other. The second plastic component 5 may be clamped and tightened through the two cutting edges 13, and at the same time, the second plastic component 5 may be stably installed in the bottom shell 1 in combination with a connecting structure between the second plastic component 5 and the first plastic component 4.

Referring to FIG. 1, further, the bottom shell 1 is removably connected with the upper cover 2 through a plurality of buckle structures, and each buckle structure is successively arranged along the edge of the bottom shell 1 at interval. The buckle structure may be in a structural form of a slot being matched with a pin. The pin is successively arranged along the edge of the bottom shell 1 at interval. The slot is arranged inside the upper cover 2. After each pin corresponds to each slot one to one, the upper cover 2 is buckled on the bottom shell 1, while when disassembling, both of the two need to be separated merely, which is relatively convenient.

Referring to FIG. 1 and FIG. 2, an electronic device is further provided according to another embodiment of the present invention, comprising housing and a processor built in the housing. The housing is further internally provided with the above transfer card, the electric conduction portion 52 of which is electrically communicated with the processor. In the embodiment of the present invention, the above transfer card is applied in the electronic device, so that the electronic device has a function of reading the Mico SD UHS-II card. A user merely needs to insert the Mico SD UHS-II card into the accommodating cavity 3 along the socket 31 of the transfer card. The electronic device may be a laptop or the like.

The above is the preferred embodiments of the present invention merely, but not intended to limit the present invention. Any modifications, equivalent replacements, improvements and the like made within the spirit and principle of the present invention shall all fall within the protection scope of the present invention.

The invention claimed is:
1. An electronic transfer card, comprising
a bottom shell,
an upper cover located above the bottom shell, and
an accommodating cavity formed by the enclosing of the bottom shell and the upper cover, the accommodating cavity being provided with a socket for a clip piece to insert and a window capable of performing information transmission to an external electronic component,
wherein:
a first plastic component and a second plastic component are arranged in the accommodating cavity;
the first plastic component is clamped in the bottom shell, and is provided with a plurality of first connecting terminals capable of electrically contacting with the clip piece;
the second plastic component is arranged on and partly overlapped with the first plastic component;
the second plastic component is provided with a plurality of second connecting terminals capable of electrically contacting with the clip piece and an electric conduction portion capable of performing the information transmission to the external electronic component; and
the electric conduction portion is electrically communicated with each second connecting terminal;
wherein the first plastic component is provided with a first opening and a second opening, each of the first connecting terminals is located in the first opening, and each of the second connecting terminals is extended from an end portion of the second plastic component into the second opening.

2. The electronic transfer card according to claim 1, wherein each of the first connecting terminals and the second connecting terminals is respectively provided with a bending portion protrudeing out of a surface of the first plastic component departing from the bottom shell.

3. The electronic transfer card according to claim 2, wherein all of the bending portions of the first connecting terminals and the second connecting terminals are located in a same plane.

4. The electronic transfer card according to claim 1, wherein the second plastic component is provided with a projection at a side thereof next to the first plastic component, each of the second connecting terminals is lead out from an end portion of the projection, and the projection is clamped in the second opening.

5. The electronic transfer card according to claim 1, wherein the bottom shell is provided with a first recessed portion and a second recessed portion, a bottom surface of the second recessed portion protrudes out of a bottom surface of the first recessed portion, the first plastic component is provided with a first engagement surface engaged with the bottom surface of the first recessed portion and a second engagement surface engaged with the bottom surface of the second recessed portion, and edges of the first plastic component are successively snapped to side walls of the first recessed portion and side walls of the second recessed portion.

6. The electronic transfer card according to claim 1, wherein the bottom shell is provided with two cutting edges at the side walls thereof, which are arranged opposite to each other, and the edges of the second plastic component are snapped with the two cutting edges.

7. The electronic transfer card according to claim 1, wherein the bottom shell is removably connected to the upper cover through a plurality of buckle structures, and each of the buckle structures is successively arranged along the edge of the bottom shell at interval.

8. The electronic transfer card according to claim 1, wherein the window is opened in the bottom shell and the socket is located at one end of the bottom shell opposite to the window.

* * * * *